United States Patent
Fukushima et al.

(10) Patent No.: US 12,036,666 B2
(45) Date of Patent: Jul. 16, 2024

(54) ACTUATOR

(71) Applicant: THK CO., LTD., Tokyo (JP)

(72) Inventors: Katsuya Fukushima, Tokyo (JP); Masashi Ishii, Tokyo (JP); Hiroki Niwa, Tokyo (JP); Shigeki Hayashi, Kawasaki (JP); Akira Suzuki, Tokyo (JP); Kazuto Oga, Tokyo (JP); Shogo Wakuta, Tokyo (JP); Satoshi Hara, Tokyo (JP); Tomofumi Mizuno, Tokyo (JP); Satoru Nagai, Tokyo (JP)

(73) Assignee: THK CO., LTD., Tokyo (JP)

( * ) Notice: Subject to any disclaimer, the term of this patent is extended or adjusted under 35 U.S.C. 154(b) by 718 days.

(21) Appl. No.: 17/263,704

(22) PCT Filed: Aug. 1, 2019

(86) PCT No.: PCT/JP2019/030252
§ 371 (c)(1),
(2) Date: Jan. 27, 2021

(87) PCT Pub. No.: WO2020/027270
PCT Pub. Date: Feb. 6, 2020

(65) Prior Publication Data
US 2021/0370526 A1 Dec. 2, 2021

(30) Foreign Application Priority Data
Aug. 1, 2018 (JP) ................................ 2018-144866

(51) Int. Cl.
*B25J 15/06* (2006.01)
(52) U.S. Cl.
CPC ....... *B25J 15/0625* (2013.01); *B25J 15/0658* (2013.01)

(58) Field of Classification Search
CPC .... B25J 15/06; B25J 15/0625; B25J 15/0658; B25J 15/0616; B25J 15/0633; H05K 13/0409
(Continued)

(56) References Cited

U.S. PATENT DOCUMENTS

| 4,657,470 A | 4/1987 | Clarke et al. |
| 5,113,581 A | 5/1992 | Hidese |

(Continued)

FOREIGN PATENT DOCUMENTS

| CN | 104380855 A | 2/2015 |
| JP | 61-121891 A | 6/1986 |

(Continued)

OTHER PUBLICATIONS

Office Action dated Jul. 14, 2022, issued in counterpart IN Application No. 202147007005, with English Translation. (5 pages).
(Continued)

*Primary Examiner* — Glenn F Myers
(74) *Attorney, Agent, or Firm* — WHDA, LLP (57) ABSTRACT

The present invention reduces tact time for a pick-and-place operation by an actuator. In a housing of the actuator, an air passage being a passage of air when sucking air from a hollow part of a shaft is provided. Furthermore, a sucking valve that sucks air from the hollow part of the shaft through the air passage and a suction detecting sensor to detect that a workpiece is suctioned onto a tip of the shaft are provided in the air passage. Then, in the housing, the air passage is disposed at a position on a side opposite to a linear motion motor that moves the shaft in an axial direction of the shaft, via the shaft.

5 Claims, 5 Drawing Sheets (58) Field of Classification Search
USPC .......................................................... 414/627
See application file for complete search history.

(56) References Cited

U.S. PATENT DOCUMENTS

| | | | | |
|---|---|---|---|---|
| 9,948,218 | B2* | 4/2018 | Yamanaka | ............ B30B 15/148 |
| 2002/0046461 | A1* | 4/2002 | Oe | ..................... H05K 13/0409 |
| | | | | 29/743 |
| 2002/0088107 | A1* | 7/2002 | Van De Rijdt | .... H05K 13/0409 |
| | | | | 29/832 |
| 2004/0042890 | A1* | 3/2004 | Hirata | ................ H05K 13/0413 |
| | | | | 414/752.1 |

FOREIGN PATENT DOCUMENTS

| | | | |
|---|---|---|---|
| JP | 2004-88024 | A | 3/2004 |
| JP | 2009-16512 | A | 1/2009 |
| JP | 5113534 | B2 | 1/2013 |
| WO | 2010/036204 | A1 | 4/2010 |

OTHER PUBLICATIONS

Office Action dated Sep. 5, 2022, issued in counterpart TW application No. 108127175, with English translation. (12 pages).

* cited by examiner

ACTUATOR

TECHNICAL FIELD

The present invention relates to an actuator that performs a pick-and-place operation.

BACKGROUND ART

Heretofore, an actuator has been known which performs a series of operations (a pick-and-place operation) of picking up a workpiece with a shaft, and placing the picked up workpiece at a predetermined position with the shaft (e.g., see Patent Document 1). In the actuator that performs such a pick-and-place operation, a negative pressure is generated in an interior of the shaft in a state where a tip of the hollow shaft is pushed against the workpiece, to suction the workpiece onto the tip of the shaft, thereby picking up the workpiece.

CITATION LIST

Patent Literature

Patent Document 1: Japanese Patent No. 5113534

SUMMARY OF INVENTION

Technical Problem

In an actuator that performs a pick-and-place operation as described above, for suctioning the workpiece onto a tip of a shaft, it is necessary to generate a negative pressure at the tip. To this end, in a configuration that has been employed heretofore, an air pipe is connected to the shaft, and air is sucked from an interior of the shaft through the air pipe, to generate the negative pressure at a tip of the shaft. In this configuration, generally, the air pipe is present outside the actuator. Furthermore, a sucking valve to suck air from the interior of the shaft through the air pipe and a suction detecting sensor to detect that the workpiece is suctioned onto the tip of the shaft are also provided outside the actuator.

Here, for appropriately executing the pick-and-place operation by the actuator, when picking up the workpiece, it is necessary to ensure that the workpiece is suctioned onto the tip of the shaft, and to detect the suction of the workpiece onto the tip of the shaft. However, in such a configuration as described above, if a volume of an air path from the tip of the shaft to the sucking valve (the air path including the shaft and the air pipe) is made larger, a period from when the sucking valve is opened to start to suck air until the negative pressure is generated at the tip of the shaft to suction the workpiece onto the tip (hereinafter, referred to as "a suction period") lengthens. Furthermore, if a volume of an air path from the tip of the shaft to the suction detecting sensor is made larger, a period from when the workpiece is actually suctioned onto the tip until the suction detecting sensor detects the suction of the workpiece (hereinafter, referred to as "a detection period") lengthens. Thus, as the suction period or the detection period lengthens, tact time for the pick-and-place operation by the actuator might lengthen.

An object of the present invention, which has been developed in view of such a problem as described above, is to provide a technique capable of reducing tact time for a pick-and-place operation by an actuator.

Solution to Problem

According to the present invention, provided is an actuator in which a shaft including a hollow part formed on at least a tip side of the shaft so that an interior of the shaft is hollow is housed in a housing in a protruding state of a tip of the shaft, and a negative pressure is generated at the tip of the shaft to suction a workpiece onto the tip, thereby picking up the workpiece, the actuator comprising:

- a linear motion motor that moves the shaft in an axial direction of the shaft,
- an air passage in communication with the hollow part of the shaft, the air passage being a passage of air when sucking air from the hollow part,
- a sucking valve provided in the air passage, to suck air from the hollow part of the shaft through the air passage, and
- a suction detecting sensor provided in the air passage, to detect that the workpiece is suctioned onto the tip of the shaft, wherein in the housing, the air passage is disposed at a position on a side opposite to the linear motion motor via the shaft.

Advantageous Effects of Invention

According to the present invention, tact time for a pick-and-place operation by an actuator can be reduced.

MODE FOR CARRYING OUT THE INVENTION

In an actuator according to the present invention, a shaft having a tip in a protruding state is housed in a housing. Furthermore, on at least a tip side of the shaft, a hollow part is formed so that an interior of the shaft is hollow. Consequently, if air is sucked from the hollow part of the shaft, a negative pressure is generated at the tip of the shaft.

Furthermore, in the housing, a linear motion motor, an air passage, a sucking valve and a suction detecting sensor are provided. The linear motion motor is a motor that moves the shaft in an axial direction, when picking up or placing a workpiece with the shaft. The air passage is in communication with the hollow part of the shaft, and is a passage of air when sucking air from the hollow part. That is, in the actuator, when picking up the workpiece, air is sucked from the hollow part of the shaft through the air passage.

Additionally, the sucking valve and the suction detecting sensor are provided in the air passage in the housing. That is, in the present invention, the sucking valve and the suction detecting sensor are integrated with the actuator. Then, the sucking valve may be opened, to suck air from the hollow part of the shaft through the air passage. Furthermore, the suction detecting sensor detects a change in pressure or flow rate of air in the air passage, so that it can be detected that the workpiece is suctioned onto the tip of the shaft.

Here, in the housing of the actuator, the linear motion motor to move the shaft is disposed in a vicinity of the shaft. For that reason, in the housing, if the air passage is disposed at a position in the same direction as in the linear notion motor relative to the shaft, it is necessary to extend the air passage from the shaft to a position beyond the linear motion motor, and additionally to provide the sucking valve and the suction detecting sensor in the air passage. That is, the linear motion motor is located between the shaft and the sucking valve and suction detecting sensor.

In contrast, according to the present invention, in the housing, the air passage is disposed at a position on a side opposite to the linear motion motor via the shaft. Consequently, it is not necessary to extend the air passage from the shaft to the position beyond the linear motion motor as described above. That is, a distance from the shaft to the sucking valve and the suction detecting sensor can be smaller, as compared with a case where the linear motion motor is located between the shaft and the sucking valve and suction detecting sensor. Therefore, an air path from the tip of the shaft to the sucking valve and an air path from the tip of the shaft to the suction detecting sensor can be shortened as much as possible.

Therefore, according to the present invention, the actuator can be integrated with the sucking valve and the suction detecting sensor, and additionally, a volume of each of the air path from the tip of the shaft to the sucking valve and the air path from the tip of the shaft to the suction detecting sensor can be decreased as much as possible. Consequently, a suction period and a detection period in performing the pick-and-place operation can be reduced. As a result, tact time for the pick-and-place operation can be reduced.

Furthermore, a plurality of actuators may be installed in a stacked state. In this case, according to a configuration of the present invention, the plurality of actuators can be stacked so that positions of respective linear motion motors are staggered about respective shafts between adjacent actuators. In a case where the plurality of actuators are stacked in this manner, heat generated by the linear motion motor of each actuator is more easily dispersed, as compared with a case where positions of respective linear motion motors are superimposed on one another in a plurality of stacked actuators. Therefore, when the plurality of actuators are installed in the stacked state, effect of heat generated by the linear motion motors on the respective actuators can be reduced.

Hereinafter, specific examples of the present invention will be described with reference to the drawings. A dimension, material, shape, relative arrangement and the like of a component described in the present example do not intend to restrict a technical scope of the invention unless otherwise described.

Embodiment

Figure 1:
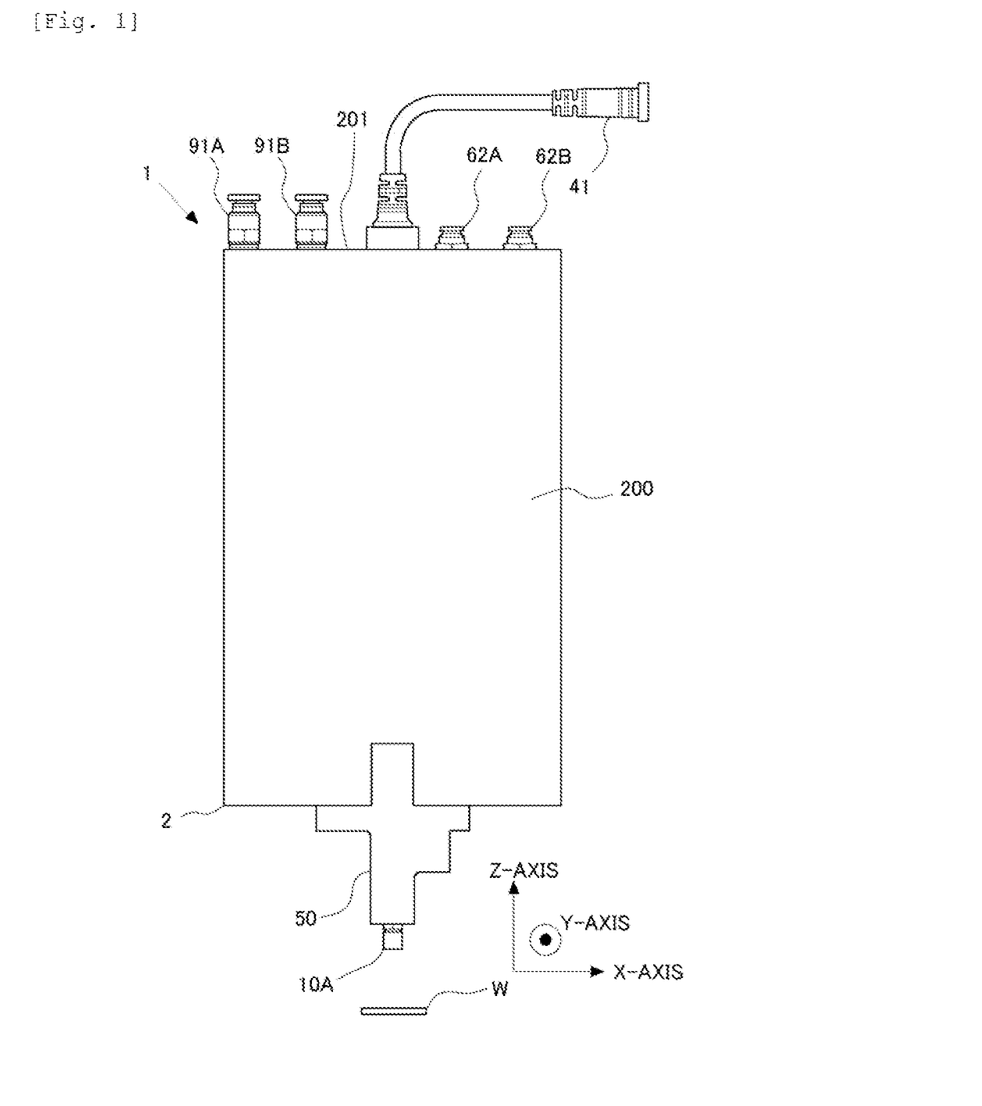
FIG. 1 is an appearance view of an actuator according to an embodiment.
Figure 2:
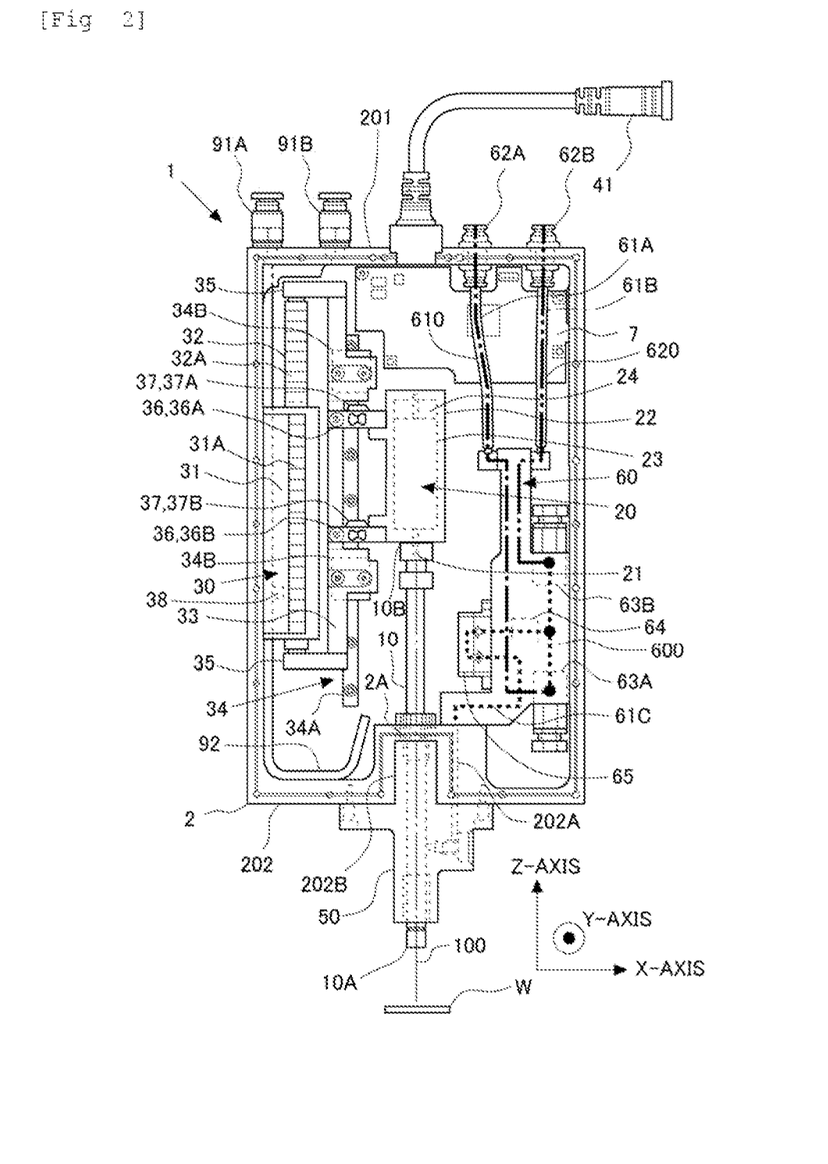
FIG. 2 is a schematic configuration view illustrating an inner structure of the actuator according to the embodiment.

FIG. 1 is an appearance view of an actuator 1 according to the present embodiment. The actuator 1 includes a housing 2 having a substantially rectangular parallelepiped outer shape, and a lid 200 is attached to the housing 2. FIG. 2 is a schematic configuration view illustrating an inner structure of the actuator 1 according to the present embodiment. A part of a shaft 10 is housed within the housing 2. The shaft 10 is formed to be hollow on a tip 10A side. In a material of the shaft 10 and the housing 2, for example, a metal (e.g., aluminum) may be used, or a resin or the like may be used.

Note that in the following description, an XYZ orthogonal coordinate system will be set, and positions of respective members will be described with reference to this XYZ orthogonal coordinate system. A long side direction of the largest surface of the housing 2, i.e., a direction of a central axis 100 of the shaft 10 is a Z-axis direction, a short side direction of the largest surface of the housing 2 is an X-axis direction, and a direction that is orthogonal to the largest surface of the housing 2 is a Y-axis direction. The Z-axis direction is also a perpendicular direction. Note that hereinafter, an upper side in the Z-axis direction in FIG. 2 is an upper side of the actuator 1, and a lower side in the Z-axis direction in FIG. 2 is a lower side of the actuator 1. Furthermore, a right side in the X-axis direction in FIG. 2 is a right side of the actuator 1, and a left side in the X-axis direction in FIG. 2 is a left side of the actuator 1. Additionally, a front side in the Y-axis direction in FIG. 2 is a front side of the actuator 1, and a back side in the Y-axis direction in FIG. 2 is a back side of the actuator 1. The housing 2 is formed such that a dimension in the Z-axis direction is larger than a dimension in the X-axis direction, and a dimension in the X-axis direction is larger than a dimension in the Y-axis direction. In the housing 2, a region corresponding to one surface (a front surface in FIG. 2) orthogonal to the Y-axis direction is open, and this opening is closed with the lid 200. The lid 200 is fixed to the housing 2 with, for example, screws.

The housing 2 houses therein a rotating motor 20 that rotates the shaft 10 about the central axis 100, a linear motion motor 30 that moves the shaft 10 relatively straight in a direction along the central axis 100 (i.e., the Z-axis direction) relative to the housing 2, and an air control mechanism 60. Furthermore, a shaft housing 50 into which the shaft 10 is inserted is attached to a lower end face 202 of the housing 2 in the Z-axis direction. In the housing 2, a recess 202B is formed to be recessed from the lower end face 202 toward an interior of the housing 2, and a part of the shaft housing 50 is inserted into the recess 202B. A through hole 2A in the Z-axis direction is formed in an upper end of the recess 202B in the Z-axis direction, and the shaft 10 is inserted into the through hole 2A and the shaft housing 50. The tip 10A of the shaft 10 on the lower side in the Z-axis direction protrudes outward from the shaft housing 50. The shaft 10 is provided at a center of the housing 2 in the X-axis direction and a center of the housing in the Y-axis direction. That is, the shaft 10 is provided such that a central axis extending in the Z-axis direction through the center of the housing 2 in the X-axis direction and the center of the housing in the Y-axis direction is superimposed on the central axis 100 of the shaft 10. The shaft 10 is moved straight in the Z-axis direction by the linear motion motor 30, and is rotated about the central axis 100 by the rotating motor 20.

A base end 10B side of the shaft 10 that is an end on a side opposite to the tip 10A (an upper end in the Z-axis direction) is housed in the housing 2, and connected to an output shaft 21 of the rotating motor 20. The rotating motor 20 rotatably supports the shaft 10. A central axis of the output shaft 21 of the rotating motor 20 coincides with the central axis 100 of the shaft 10. The rotating motor 20 includes, in addition to the output shaft 21, a stator 22, a rotor 23 that rotates in the stator 22, and a rotary encoder 24 that detects a rotation angle of the output shaft 21. The rotor 23 rotates relative to the stator 22, and the output shaft 21 and the shaft 10 also rotate in conjunction with the stator 22.

The linear motion motor 30 includes a stator 31 fixed to the housing 2, and a mover 32 that relatively moves in the Z-axis direction relative to the stator 31. The linear motion motor 30 is, for example, a linear motor. The stator 31 is provided with a plurality of coils 31A, and the mover 32 is provided with a plurality of permanent magnets 32A. The coils 31A are arranged at a predetermined pitch in the Z-axis direction, and a plurality of sets of three coils 31A of U, V, and W-phases are provided. In the present embodiment, a three-phase armature current is applied to the coils 31A of the U, V, and W-phases to generate a straight moving magnetic field, and the mover 32 is straight moved relative to the stator 31. The linear motion motor 30 is provided with a linear encoder 38 that detects a relative position of the mover 32 to the stator 31. Note that in place of the above configuration, the stator 31 may be provided with a permanent magnet, and the mover 32 may be provided with a plurality of coils.

The mover 32 of the linear motion motor 30 is coupled to the stator 22 of the rotating motor 20 via a linear motion table 33. The linear motion table 33 is movable with movement of the mover 32 of the linear motion motor 30. The movement of the linear motion table 33 is guided in the Z-axis direction by a linear motion guide device 34. The linear motion guide device 34 includes a rail 34A fixed to the housing 2, and a slider block 34B attached to the rail 34A. The rail 34A is configured to extend in the Z-axis direction, and the slider block 34B is configured to be movable along the rail 34A in the Z-axis direction.

The linear motion table 33 is fixed to the slider block 34B, and is movable together with the slider block 34B in the Z-axis direction. The linear motion table 33 is coupled to the mover 32 of the linear motion motor 30 via two coupling arms 35. The two coupling arms 35 couple opposite ends of the mover 32 in the Z-axis direction to opposite ends of the linear motion table 33 in the Z-axis direction. Furthermore, the linear motion table 33 is coupled, on a central side of the opposite ends, to the stator 22 of the rotating motor 20 via two coupling arras 36. Note that the coupling arm 36 on the upper side in the Z-axis direction will be referred to as a first arm 36A, and the coupling arm 36 on the lower side in the Z-axis direction will be referred to as a second arm 36B. Furthermore, the first arm 36A and the second arm 36B will be referred to simply as the coupling arms 36 when the arms are not distinguished. For the stator 22 of the rotating motor 20, since the linear motion table 33 is coupled to the stator 22 of the rotating motor 20 via the coupling arms 36, the stator 22 of the rotating motor 20 also moves with the movement of the linear motion table 33. The coupling arm 36 has a quadrangular cross section. A strain gauge 37 is fixed to a surface of each coupling arm 36 which faces upward in the Z-axis direction. Note that the strain gauge 37 fixed to the first arm 36A will be referred to as a first strain gauge 37A, and the strain gauge 37 fixed to the second arm 36B will be referred to as a second strain gauge 37B. The first strain gauge 37A and the second strain gauge 37B will be referred to simply as the strain gauges 37 when the gauges are not distinguished. Note that two strain gauges 37 of the present embodiment are provided on surfaces of the coupling arms 36 which face upward in the Z-axis direction, respectively. In place of the surfaces, the gauges may be provided on surfaces of the coupling arm 36 that face downward in the Z-axis direction.

The air control mechanism 60 is a mechanism to generate a positive pressure or a negative pressure at the tip 10A of the shaft 10. That is, the air control mechanism 60 sucks air in the shaft 10 during pickup of a workpiece W, to generate the negative pressure at the tip 10A of the shaft 10. Consequently, the workpiece W is suctioned onto the tip 10A of the shaft 10. Furthermore, air is supplied into the shaft 10, to generate the positive pressure at the tip 10A of the shaft 10. Thus, the workpiece W is easily removed from the tip 10A of the shaft 10.

Furthermore, the shaft 10 is disposed in a center of the housing 2 in the X-axis direction. Furthermore, the air control mechanism 60 is disposed at a position on a side opposite to the linear motion motor 30 via the shaft 10 in the housing 2. That is, in FIG. 2, the stator 31 and the mover 32 of the linear motion motor 30 are arranged on the left as one faces via the shaft 10, and the air control mechanism 60 is disposed on the right as one faces. Then, the shaft 10 is disposed in the center in a direction where the linear motion motor 30, the shaft 10 and the air control mechanism 60 are arranged in the housing 2.

The air control mechanism 60 includes a positive pressure passage 61A (see a dashed chain line) through which positive pressure air flows, a negative pressure passage 61B (see a double-dashed chain line) through which negative pressure air flows, and a shared passage 61C (see a broken line) shared by the positive pressure air and the negative pressure air. The positive pressure passage 61A has one end connected to a positive pressure connector 62A provided on an upper end face 201 of the housing 2 in the 2-axis direction, and the positive pressure passage 61A has the other end connected to a solenoid valve for positive pressure (hereinafter, referred to as a positive pressure solenoid valve 63A). The positive pressure solenoid valve 63A is opened and closed by an after-mentioned controller 7. Note that the positive pressure passage 61A has one end portion constituted of a tube 610, and the other end portion constituted of a hole made in a block 600. The positive pressure connector 62A extends through the upper end face 201 of the housing 2 in the Z-axis direction, and the positive pressure connector 62A is connected to an external tube linked to an air discharging pump or the like.

The negative pressure passage 61B has one end connected to a negative pressure connector 62B provided on the upper end face 201 of the housing 2 in the Z-axis direction, and the negative pressure passage 61B has the other end connected to a solenoid valve for negative pressure (hereinafter, referred to as a negative pressure solenoid valve 63B). The negative pressure solenoid valve 63B is opened and closed by the after-mentioned controller 7. Note that the negative pressure passage 61B has one end portion constituted of a tube 620, and the other end portion constituted of a hole made in the block 600. The negative pressure connector 62B extends through the upper end face 201 of the housing 2 in the Z-axis direction, and the negative pressure connector 62B is connected to an external tube linked to an air sucking pump or the like.

The shared passage 61C is constituted of a hole made in the block 600. The shared passage 61C has one end branching into two to be connected to the positive pressure solenoid valve 63A and the negative pressure solenoid valve 63B, and the shared passage 61C has the other end connected to an air flow passage 202A that is a through hole formed in the housing 2. The air flow passage 202A communicates with the shaft housing 50. The negative pressure solenoid valve 63B is opened and the positive pressure solenoid valve 63A is closed, to communicate between the negative pressure passage 61B and the shared passage 61C, thereby generating the negative pressure in the shared passage 61C. Then, air is sucked from the shaft housing 50 through the air flow passage 202A. On the other hand, the positive pressure solenoid valve 63A is opened and the negative pressure solenoid valve 63B is closed, to communicate between the positive pressure passage 61A and the shared passage 61C, thereby generating the positive pressure in the shared passage 61C. Then, air is supplied into the shaft housing 50 through the air flow passage 202A. The shared passage 61C is provided with a pressure sensor 64 that detects a pressure of air in the shared passage 61C and a flow sensor 65 that detects a flow rate of air in the shared passage 61C.

Note that in the actuator 1 illustrated in FIG. 2, the positive pressure passage 61A and the negative pressure passage 61B have a part constituted of a tube, and the other part constituted of a hole made in the block 600. The present invention is not limited to this embodiment, and all the passages may be constituted of tubes, or all the passages may be constituted of holes made in the block 600. This also applies to the shared passage 61C, and the passage may be entirely constituted of a tube, or may be constituted by combined use of the tube. Note that a material of the tube 610 and the tube 620 may be a material such as a resin having flexibility, or may be a material such as a metal that does not have any flexibility. Furthermore, an atmospheric pressure may be supplied, instead of supplying the positive pressure to the shaft housing 50 by use of the positive pressure passage 61A.

Additionally, on the upper end face 201 of the housing 2 in the Z-axis direction, provided are a connector (hereinafter, referred to as an inlet connector 91A) that is an inlet of air for cooling the rotating motor 20 and a connector (hereinafter, referred to as an outlet connector 91B) that is an outlet of air from the housing 2. The inlet connector 91A and the outlet connector 91B extend through the upper end face 201 of the housing 2 so that air can flow through. A tube linked to an air discharge pump or the like is connected to the inlet connector 91A from outside the housing 2, and a tube that discharges air flowing out of the housing 2 is connected to the outlet connector 91B from outside the housing 2. The interior of the housing 2 is provided with a metal pipe (hereinafter, referred to as a cooling pipe 92) through which air for cooling the rotating motor 20 flows, and the cooling pipe 92 has one end connected to the inlet connector 91A. The cooling pipe 92 is formed to extend from the inlet connector 91A in the Z-axis direction to a vicinity of the lower end face 202 of the housing 2, and to curve in the vicinity of the lower end face 202 such that, the pipe, at the other end, faces the rotating motor 20. Thus, air is supplied from the lower side in the Z-axis direction into the housing 2, thereby allowing efficient cooling. Furthermore, an open end (the other end) of the cooling pipe 92 faces the rotating motor 20, and hence the rotating motor 20 can be efficiently cooled by air discharged from the cooling pipe 92. Furthermore, the cooling pipe 92 extends through the stator 31, to take heat from the coils 31A of the linear motion motor 30. The coils 31A are arranged around the cooling pipe 92, to take more heat from the coils 31A provided in the stator 31. That is, heat exchange is performed between air flowing through the cooling pipe 92 and the stator 31 of the linear motion motor 30. Therefore, the linear motion motor 30 can be efficiently cooled.

The upper end face 201 of the housing 2 in the Z-axis direction is connected to a connector 41 including a power supplying wire and a signal line. Furthermore, the housing 2 is provided with the controller 7. The wire or signal line pulled from the connector 41 into the housing 2 is connected to the controller 7. The controller 7 is provided with a central processing unit (CPU), a random access memory (RAM), a read only memory (ROM), and an erasable programmable ROM (EPROM), which are connected to one another via a bus. In the EPROM, various programs, various tables and others are stored. The program stored in the EPROM is loaded and executed in a work area of the RAM by the CPU, and through the execution of this program, the rotating motor 20, the linear motion motor 30, the positive pressure solenoid valve 63A, the negative pressure solenoid valve 63B and others are controlled. Thus, the CPU achieves a function that meets a predetermined purpose. Furthermore, output signals of the pressure sensor 64, the flow sensor 65, the strain gauge 37, the rotary encoder 24 and the linear encoder 38 are input into the controller 7.

Figure 3:
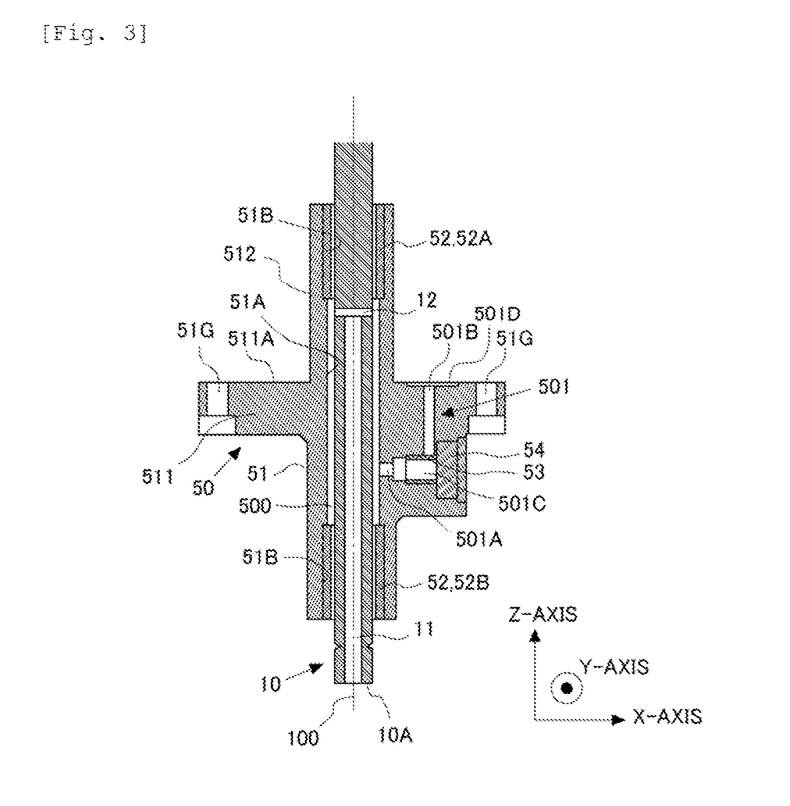
FIG. 3 is a cross-sectional view illustrating a schematic configuration including a shaft housing and a tip of a shaft according to the embodiment.

FIG. 3 is a cross-sectional view illustrating a schematic configuration including the shaft housing 50 and the tip 10A of the shaft 10. The shaft housing 50 includes a housing body 51, two rings 52, a filter 53, and a filter stop 54. In the housing body 51, a through hole 51A is formed into which the shaft 10 is inserted. The through hole 51A extends through the housing body 51 in the Z-axis direction, and an upper end of the through hole 51A in the Z-axis direction communicates with the through hole 2A formed in the housing 2. A diameter of the through hole 51A is larger than an outer diameter of the shaft 10. Consequently, a space is provided between an inner surface of the through hole 51A and an outer surface of the shaft 10. In opposite ends of the through hole 51A, enlarged parts 51B each having a hole diameter enlarged are provided. The rings 52 are fitted in two enlarged parts 51B, respectively. Each ring 52 is formed in a cylindrical shape, and an inner diameter of the ring 52 is slightly larger than the outer diameter of the shaft 10. Consequently, a space is also formed between an inner surface of the ring 52 and the outer surface of the shaft 10. Therefore, the shaft 10 is movable in the Z-axis direction in the ring 52, and the shaft 10 is rotatable about the central axis 100 in the ring 52. However, the space formed between the inner surface of the ring 52 and the outer surface of the shaft 10 is smaller than the space formed between the inner surface of the through hole 51A excluding the enlarged parts 51B and the outer surface of the shaft 10. Note that the ring 52 on the upper side in the Z-axis direction will be referred to as a first ring 52A, and the ring 52 on the lower side in the Z-axis direction will be a second ring 52B. The first ring 52A and the second ring 52B will be referred to simply as the rings 52 when the rings are not distinguished. In a material of the ring 52, for example, a metal or a resin may be used.

A protrusion 511 protruding in opposite right and left directions in the X-axis direction is formed in a central part of the housing body 51 in the Z-axis direction. In the protrusion 511, a mounting surface 511A is formed which is a surface parallel to the lower end face 202 of the housing 2, the surface coming in contact with the lower end face 202, when the shaft housing 50 is mounted to the lower end face 202 of the housing 2. The mounting surface 511A is a surface orthogonal to the central axis 100. Furthermore, a part 512 that is a part of the shaft housing 50 on the upper side of the mounting surface 511A in the Z-axis direction is formed to fit in the recess 202B formed in the housing 2, when the shaft housing 50 is mounted to the housing 2.

The space is provided between the inner surface of the through hole 51A and the outer surface of the shaft 10 as described above. As a result, in the housing body 51, an inner space 500 is formed which is a space surrounded with the inner surface of the through hole 51A, the outer surface of the shaft 10, a lower end face of the first ring 52A, and an upper end face of the second ring 52B. Furthermore, in the shaft housing 50, a control passage 501 is formed which communicates between an opening of the air flow passage 202A formed in the lower end face 202 of the housing 2 and the inner space 500 to form an air passage. The control passage 501 includes a first passage 501A extending in the X-axis direction, a second passage 501B extending in the Z-axis direction, and a filter part 501C that is a space where the first passage 501A and the second passage 501B are connected and the filter 53 is disposed. The first passage 501A has one end connected to the inner space 500, and the other end connected to the filter part 501C. The second passage 501B has one end opened in the mounting surface 511A and aligned to be connected to the opening of the air flow passage 202A.

Furthermore, the second passage 501B has the other end connected to the filter part 501C. In the filter part 501C, the filter 53 formed in a cylindrical shape is provided. The filter part 501C is formed in a columnar space extending in the X-axis direction such that a central axis coincides with that of the first passage 501A. An inner diameter of the filter part 501C is substantially equal to an outer diameter of the filter 53. The filter 53 is inserted into the filter part 501C in the X-axis direction. After the filter 53 is inserted into the filter part 501C, an end of the filter part 501C which is an insertion port of the filter 53 is closed with the filter stop 54. The other end of the second passage 501B is connected to the filter part 501C from a side of an outer circumferential surface of the filter 53. Furthermore, the other end of the first passage 501A communicates with a central side of the filter 53. Therefore, air flowing through a space between the first passage 501A and the second passage 501B flows through the filter 53. Therefore, foreign matter is captured by the filter 53, even if the foreign matter is sucked together with air into the inner space 500, for example, when the negative pressure is generated at the tip 10A. In the one end of the second passage 501B, a groove 501D is formed to hold sealant.

In vicinities of opposite ends of the protrusion 511 in the X-axis direction, two bolt holes 51G are formed into which bolts are inserted, when the shaft housing 50 is fixed to the housing 2 by use of the bolts. The bolt holes 51G extend through the protrusion 511 in the Z-axis direction and opens in the mounting surface 511A.

A hollow part 11 is formed on the tip 10A side of the shaft 10 such that the shaft 10 is hollow. The hollow part 11 has one end opened at the tip 10A. Furthermore, at the other end of the hollow part 11, a communication hole 12 that communicates between the inner space 500 and the hollow part 11 in the X-axis direction is formed. The communication hole 12 is formed to communicate between the inner space 500 and the hollow part 11, in an entire range of a stroke when the shaft 10 is moved in the Z-axis direction by the linear motion motor 30. Therefore, the tip IDA of the shaft 10 communicates with the air control mechanism 60 through the hollow part 11, the communication hole 12, the inner space 500, the control passage 501, and the air flow passage 202A. Note that the communication hole 12 may be formed in the Y-axis direction in addition to the X-axis direction.

According to this configuration, the communication hole 12 always communicates between the inner space 500 and the hollow part 11, even if the shaft 10 is at any position in the Z-axis direction when the linear motion motor 30 is driven to move the shaft 10 in the Z-axis direction. Furthermore, the communication hole 12 always communicates between the inner space 500 and the hollow part 11, even if a rotation angle of the shaft 10 is any angle about the central axis 100 when the rotating motor 20 is driven to rotate the shaft 10 about the central axis 100. Therefore, a communication state between the hollow part 11 and the inner space 500 is maintained even if the shaft 10 is in any state, and hence the hollow part 11 always communicates with the air control mechanism 60. For that reason, air in the hollow part 11 is sucked through the air flow passage 202A, the control passage 501, the inner space 500, and the communication hole 12, if the positive pressure solenoid valve 63A is closed and the negative pressure solenoid valve 63B is opened in the air control mechanism 60, regardless of the position of the shaft 10. As a result, the negative pressure can be generated in the hollow part 11. That is, the negative pressure can be generated at the tip 10A of the shaft 10, and hence the workpiece W can be suctioned onto the tip 10A of the shaft 10. Note that the space is also formed between the inner surface of the ring 52 and the outer surface of the shaft 10 as described above. However, this space is smaller than a space that forms the inner space 500 (i.e., the space formed between the inner surface of the through hole 51A and the outer surface of the shaft 10). Thus, in the air control mechanism 60, the positive pressure solenoid valve 63A is closed and the negative pressure solenoid valve 63B is opened, so that a flow rate of air flowing through the space between the inner surface of the ring 52 and the outer surface of the shaft 10 can be suppressed, even if air is sucked from the inner space 500. Consequently, the negative pressure at which the workpiece W can be picked up can be generated at the tip 10A of the shaft 10. On the other hand, the positive pressure can be generated in the hollow part 11, if the positive pressure solenoid valve 63A is opened and the negative pressure solenoid valve 63B is closed in the air control mechanism 60, regardless of the position of the shaft 10. That is, since the positive pressure can be generated at the tip 10A of the shaft 10, the workpiece W can be quickly removed from the tip 10A of the shaft 10.

Pick and Place Operation

Description will be mace as to pick and place of the workpiece W by use of actuator 1. The controller 7 executes a predetermined program to perform the pick and place. During the pickup of the workpiece W, the positive pressure solenoid valve 63A and the negative pressure solenoid valve 63B are both in a closed state, until the shaft 10 comes in contact with the workpiece W. In this case, the pressure of the tip 10A of the shaft 10 is the atmospheric pressure. Then, the linear motion motor 30 moves the shaft 10 downward in the Z-axis direction. Upon contact of the shaft 10 with the workpiece W, the linear motion motor 30 is stopped. After the linear motion motor 30 is stopped, the negative pressure solenoid valve 63B is opened to generate the negative pressure at the tip 10A of the shaft 10, thereby sucking the workpiece W to the tip 10A of the shaft 10.

Here, if the workpiece W is suctioned onto the tip 10A of the shaft 10, a pressure and flow rate of air in the shared passage 61C change. Therefore, it can be detected by the pressure sensor 64 and/or the flow sensor 65 that the workpiece W is suctioned onto the tip 10A of the shaft 10. Then, after it is detected by the pressure sensor 64 and/or the flow sensor 65 that the workpiece W is suctioned onto the tip 10A of the shaft 10, the shaft 10 is moved upward in the Z-axis direction by the linear motion motor 30. At this time, the shaft 10 is rotated by the rotating motor 20 as required. Thus, the workpiece W can be picked up. Note that the rotation of the shaft 10 by the rotating motor 20 may be executed after completion of the pickup of the workpiece W (i.e., after completion of the movement of the shaft 10 upward in the Z-axis direction by the linear motion motor 30).

Next, during the placing of the workpiece W, the shaft 10 in a state where the workpiece W is suctioned onto the tip 10A is moved downward in the Z-axis direction by the linear motion motor 30. If the workpiece W is grounded, the linear motion motor 30 is stopped, to stop the movement of the shaft 10. Furthermore, the negative pressure solenoid valve 63B is closed and the positive pressure solenoid valve 63A is opened, to generate the positive pressure in the tip 10A of the shaft 10. Afterward, the linear motion motor 30 moves the shaft 10 upward in the Z-axis direction, and the tip 10A of the shaft 10 accordingly leaves the workpiece W.

Here, during the pickup of the workpiece W, it is detected, using the strain gauge 37, that the tip 10A of the shaft 10 comes in contact with the workpiece W. Hereinafter, this method will be described. Note that it is similarly detected that the workpiece W is grounded during the placing of the workpiece W. If the tip 10A of the shaft 10 comes in contact with the workpiece W and the tip 10A pushes the workpiece W, a load is generated between the shaft 10 and the workpiece W. That is, the shaft 10 receives a force from the workpiece W due to reaction when the shaft 10 applies the force to the workpiece W. The force received from the workpiece W by the shaft 10 acts in a direction to generate strain relative to the coupling arm 36. That is, the strain is generated in the coupling arm 36 at this time. This strain is detected by the strain gauge 37. Then, the strain detected by the strain gauge 37 has correlation with the force received from the workpiece W by the shaft 10. Consequently, the force received from the workpiece W by the shaft 10, that is, the load generated between the shaft 10 and the workpiece W can be detected based on a detected value of the strain gauge 37. A relation between the detected value of the strain gauge and the load can be obtained beforehand by experiment, simulation or the like.

Thus, since the load generated between the shaft 10 and the workpiece W can be detected based on the detected value of the strain gauge 37, for example, it may be determined, upon the generation of the load, that the tip 10A of the shaft 10 comes in contact with the workpiece W, or it may be determined, in consideration of influence of error or the like, that the tip 10A of the shaft 10 comes in contact with the workpiece W in a case where a detected load is equal to or larger than a predetermined load. Note that the predetermined load is a threshold by which it is determined that the shaft 10 comes in contact with the workpiece W. Furthermore, the predetermined load may be set as the load with which it is possible to more securely pick up the workpiece W while inhibiting damage on the workpiece W. Additionally, the predetermined load can be changed in accordance with a type of workpiece W.

Note that in the present embodiment, "an air passage" according to the present invention is formed, including the negative pressure passage 61B, the shared passage 61C, and the air flow passage 202A. Furthermore, in the present embodiment, the negative pressure solenoid valve 63B corresponds to "a sucking valve" according to the present invention. Additionally, in the present embodiment, the pressure sensor 64 and the flow sensor 65 correspond to "a suction detecting sensor" according to the present invention. Note that it can be detected by any one of the pressure sensor 64 and the flow sensor 65 that the workpiece W is auctioned onto the tip 10A of the shaft 10. Consequently, both the pressure sensor 64 and the flow sensor 65 do not necessarily have to be arranged, and a configuration may be employed where any one of the sensors is only disposed.

Effect of Configuration According to the Present Embodiment

Hereinafter, an air path from the tip 10A of the shaft 10 to the negative pressure solenoid valve 63B (including the hollow part 11 and the communication hole 12 of the shaft 10, the inner space 500 and the control passage 501 of the shaft housing 50, the air flow passage 202A, and the shared passage 61C) will be referred to as "a first air path". Furthermore, an air path from the tip 10A of the shaft 10 to the pressure sensor 64 will be referred to as "a second air path". Additionally, an air path from the tip 10A of the shaft 10 to the flow sensor 65 will be referred to as "a third air path".

As described above, in the present embodiment, the air control mechanism 60 is provided in the housing 2 of the actuator 1. That is, the negative pressure solenoid valve 63B, the pressure sensor 64 and the flow sensor 65 are integrated with the actuator 1. Therefore, the first air path, the second air path and the third air path are shorter, as compared with a case where an air pipe to suck air from the interior of the shaft 10 is present outside the actuator 1 as in a conventional technique and the negative pressure solenoid valve 63B, the pressure sensor 64 and the flow sensor 65 are provided in the air pipe.

Furthermore, in the housing 2 of the actuator 1, the air control mechanism 60 is disposed at the position on the side opposite to the linear motion motor 30 via the shaft 10. That is, in the housing 2, the negative pressure passage 61B, the shared passage 61C and the air flow passage 202A are arranged at positions on the side opposite to the linear motion motor 30 via the shaft 10. Here, if the air control mechanism 60 is to be disposed at a position in the same direction as in the linear motion motor 30 relative to the shaft 10 in the housing 2 of the actuator 1 (i.e., at the position on the left as one faces, relative to the shaft 10 in FIG. 2), it is necessary to increase a size of the housing 2 on a linear motion motor 30 side, and to extend the air flow passage 202A or the shared passage 61C from the shaft housing 50 to a position beyond the linear motion motor 30 in the X-axis direction in FIG. 2. Then, it is additionally necessary to provide the negative pressure solenoid valve 63B, the pressure sensor 64 and the flow sensor 65, in an arrangement where the linear motion motor 30 is located between the shaft 10 and the negative pressure solenoid valve 63B, pressure sensor 64 and flow sensor 65. In this case, the shaft 10 is a way from the negative pressure solenoid valve 63B, the pressure sensor 64, and the flow sensor 65, and accordingly, the first air path, the second air path and the third air path lengthen.

On the ether hand, according to the configuration of the present embodiment, in the housing 2, the negative pressure passage 61B, the shared passage 61C and the air flow passage 202A are arranged at the positions on the side opposite to the linear motion motor 30 via the shaft 10, and hence it is not necessary to extend the air flow passage 202A or the shared passage 61C from the shaft housing 50 to the position beyond the linear motion motor 30. That is, the shaft 10 can be located closer to the negative pressure solenoid valve 63B, the pressure sensor 64 and the flow sensor 65, as compared with a case where the linear motion motor 30 is located between the shaft 10 and the negative pressure solenoid valve 63B, pressure sensor 64 and flow sensor 65. Therefore, the first air path, the second air path and the third air path can be shortened as much as possible.

Therefore, according to the configuration of the present embodiment, the negative pressure solenoid valve 63B, the pressure sensor 64 and the flow sensor 65 are integrated with the actuator 1, and additionally, volumes of the first air path, the second air path and the third air path can be decreased as much as possible. Then, as the volume of the first air path decreases, a suction period shortens. Furthermore, as the volume of the second air path decreases, a detection period by the pressure sensor 64 shortens. Additionally, as the volume of the third air path decreases, a detection period by the flow sensor 65 shortens. Consequently, according to the configuration of the present embodiment, the suction period and detection period in performing the pick-and-place operation by the actuator 1 can be shortened. As a result, tact time for the pick-and-place operation can be reduced.

Other Effects

Figure 4:
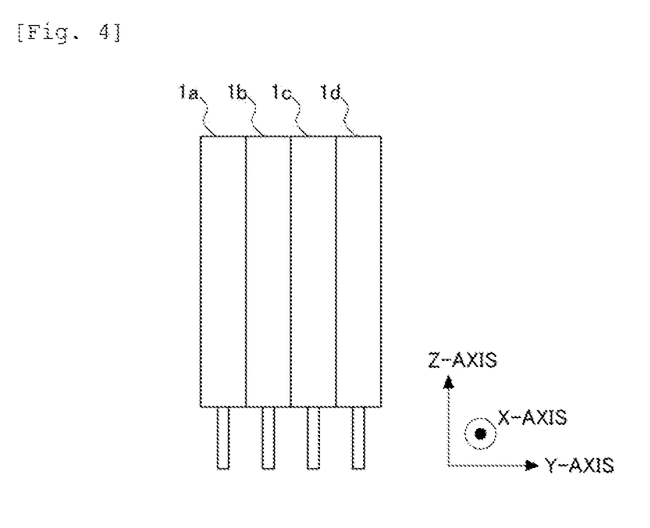
FIG. 4 is a first view illustrating a state where a plurality of actuators according to the embodiment are stacked.

Furthermore, a plurality of actuators 1 according to the present embodiment may be installed in a stacked state. FIG. 4 is a view illustrating a state where four actuators 1a, 1b, 1c and 1d are stacked in the Y-axis direction. Here, as described above, in the actuator 1, the shaft 10 is disposed in the center of the housing 2 in the X-axis direction. Therefore, in a case where the plurality of actuators 1 according to the present embodiment are installed in the stacked state in the Y-axis direction as illustrated in FIG. 4, the actuators can be installed so that front and back of adjacent actuators 1 are alternately arranged. That is, even if the plurality of actuators 1 are stacked so that the front and back of the adjacent actuators 1 are alternately arranged, a position of the shaft 10 in the X-axis direction in each actuator 1 is the same position in the center of the housing 2.

Figure 5:
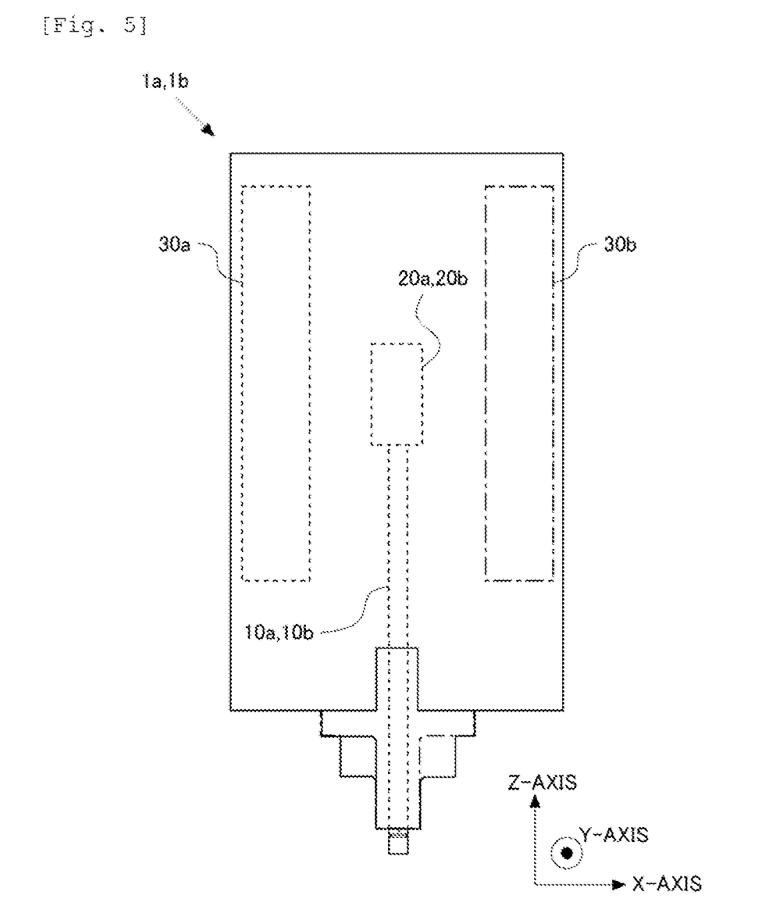
FIG. 5 is a second view illustrating the state where a plurality of actuators according to the embodiment are stacked.

FIG. 5 is a view illustrating relative positions of linear motion motors 30a, 30b in two actuators 1a, 1b, when front and back of the two actuators 1a, 1b installed adjacent to each other in FIG. 4 are alternately stacked. Even in a case where the front and back of the two actuators 1a, 1b are alternately stacked as illustrated in FIG. 5, positions of respective shafts 10a, 10b as well as positions of respective rotating motors 20a, 20b in the X-axis direction are superimposed on each other. Furthermore, in the case where the front and back of the two actuators 1a, 1b are alternately stacked in this manner, the positions of the respective linear motion motors 30a, 30b in the Y-axis direction about the respective shafts 10a, 10b are staggered. That is, in the actuator 1a, the linear motion motor 30a is located on the left as one faces relative to the shaft 10a in FIG. 5, while in the actuator 1b, the linear motion motor 30a is located on the right as one faces relative to the shaft 10b in FIG. 5.

Here, in the actuator 1, the pick-and-place operation is repeatedly performed, and heat is accordingly generated by the linear motion motor 30. At this time, in the case where the plurality of actuators 1 are stacked so that the positions of the respective linear motion motors 30 are staggered as illustrated in FIG. 5, heat generated by the linear motion motor 30 of each actuator 1 is more easily dispersed, as compared with a case where positions of linear motion motors in a plurality of stacked actuators are superimposed on one another. Consequently, in the case where the plurality of actuators 1 are installed in the stacked state, effect of heat generated by the linear motion motor 30 on the respective actuators 1 can be decreased.

Furthermore, if the positions of the linear motion motors are superimposed on one another in the plurality of stacked actuators when the linear motion motor in each actuator is a linear motor, a magnetic field generated by one linear motion motor in two adjacent actuators might affect a behavior of the other linear motion motor. On the other hand, as illustrated in FIG. 5, the plurality of actuators 1 are stacked so that the positions of the respective linear motion motors 30 are staggered, so that a distance between the linear motion motors 30 in the two adjacent actuators 1 can be increased. Therefore, a magnetic field generated by one linear motion motor 30 in two adjacent actuators 1 can be inhibited from affecting a behavior of the other linear motion motor 30.

DESCRIPTION OF THE REFERENCE NUMERALS AND SYMBOLS 1 actuator
2 housing
10 shaft
10A tip
11 hollow part
20 rotating motor
22 stator
23 rotor
30 linear motion motor
31 stator
32 mover
36 coupling arm
37 strain gauge
50 shaft housing
60 air control mechanism
500 inner space
501 control passage

The invention claimed is:

1. An actuator in which a shaft, including a hollow part formed on at least a tip side of the shaft so that an interior of the shaft is hollow, is housed in a housing in a protruding state of a tip of the shaft, and a negative pressure is generated at the tip of the shaft to suction a workpiece onto the tip, thereby picking up the workpiece, the actuator comprising:
 a linear motion motor that moves the shaft in an axial direction of the shaft,
 an air passage in communication with the hollow part of the shaft, the air passage being a passage of air when sucking air from the hollow part,
 a sucking valve provided in the air passage, to suck air from the hollow part of the shaft through the air passage, and
 a suction detecting sensor provided in the air passage, to detect that the workpiece is suctioned onto the tip of the shaft,
 wherein in the housing, the air passage, the sucking valve, and the suction detecting sensor are disposed at a position on a side opposite to the linear motion motor via the shaft.

2. The actuator according to claim 1, wherein the linear motion motor includes a stator fixed to the housing, and a mover that supports the shaft, and relatively moves in the axial direction of the shaft to the stator, and
 in the housing, the stator and the mover are arranged at positions on a side opposite to the air passage via the shaft.

3. The actuator according to claim 1, wherein the suction detecting sensor is a pressure sensor that detects a pressure of air in the air passage and/or a flow sensor that detects a flow rate of air in the air passage.

4. The actuator according to claim 2, further comprising:
 a rotating motor provided in the housing, to rotate the shaft about an axis of the shaft, and
 a cooling pipe provided in the housing, the cooling pipe allowing cooling air to flow therethrough, wherein the rotating motor is coupled to the mover of the linear motion motor, and includes an output shaft to which a base end of the shaft is connected, and the cooling pipe extends to penetrate an interior of the stator of the linear motion motor in the housing, and has an open end formed to face the rotating motor.

5. The actuator according to claim 1, wherein the shaft is disposed in a center of the housing in a direction in which the linear motion motor, the shaft and the air passage are arranged.

* * * * *